(12) United States Patent
Nagai

(10) Patent No.: US 7,179,721 B2
(45) Date of Patent: Feb. 20, 2007

(54) METHOD OF DIVIDING A NON-METAL SUBSTRATE

(75) Inventor: Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 124 days.

(21) Appl. No.: 10/849,796

(22) Filed: May 21, 2004

(65) Prior Publication Data

US 2004/0241962 A1    Dec. 2, 2004

(30) Foreign Application Priority Data

May 26, 2003    (JP) .............................. 2003-147733

(51) Int. Cl.
*H01L 21/00*    (2006.01)
(52) U.S. Cl. ..................................................... 438/460
(58) Field of Classification Search ................ 438/462, 438/460
See application file for complete search history.

(56) References Cited

U.S. PATENT DOCUMENTS

2003/0077880 A1*    4/2003    Shinjo et al. ............... 438/462

FOREIGN PATENT DOCUMENTS

JP    2002 192367    7/2002

* cited by examiner

*Primary Examiner*—Carl Whitehead, Jr.
*Assistant Examiner*—Monica D. Harrison
(74) *Attorney, Agent, or Firm*—Smith, Gambrell & Russell, LLP

(57) ABSTRACT

A method of dividing a non-metal substrate having a first surface and a second surface formed parallel to the first surface, comprising:
  a deteriorated layer forming step for forming a deteriorated layer in the inside of the non-metal substrate along dividing lines by applying a laser beam capable of passing through the non-metal substrate from the first surface side with its converging point on the inside thereof; and
  a deteriorated layer exposing step for exposing the deteriorated layer to the first surface by grinding the first surface side of the non-metal substrate having the deteriorated layer formed therein.

10 Claims, 8 Drawing Sheets

(a)

(b)

METHOD OF DIVIDING A NON-METAL SUBSTRATE

FIELD OF THE INVENTION

The present invention relates to a method of dividing a non-metal substrate such as a semiconductor wafer along predetermined dividing lines.

FIELD OF THE INVENTION

As is known to people of ordinary skill in the art, in the production of a semiconductor device, a plurality of areas are sectioned by streets (dividing lines) formed on the front surface of a substantially disk-like semiconductor wafer in a lattice form, and a circuit such as IC or LSI is formed in each of the sectioned areas. The semiconductor wafer is cut along the streets to separate the circuit-formed areas from one another, thereby manufacturing individual semiconductor chips. Cutting along the streets of the semiconductor wafer is generally carried out by a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle which is rotated at a high speed and a cutting blade mounted to the spindle. The cutting blade comprises a disk-like base and an annular cutting edge which is mounted onto the side wall of the outer peripheral portion of the base and is formed as thick as about 20 μm by fixing diamond abrasive grains having, for example, a diameter of about 3 μm to the base by electroforming. Since chips or cracks are produced in the cut surface of a semiconductor chip when a semiconductor wafer is cut with such a cutting blade, the width of each street is set to about 50 μm in anticipation of the influence of this chipping or cracking. When the semiconductor chip is reduced in size, therefore, the proportion of the total of the streets occupying the top surface of the semiconductor wafer increases, thereby reducing productivity. Cutting with the cutting blade involves problems that there is limitation to the feed speed and that the produced fine chips contaminate the semiconductor chip.

Meanwhile, as a means of dividing a non-metal substrate such as a semiconductor wafer, a laser beam processing method in which a laser beam capable of passing through the non-metal substrate is used and a laser beam having an infrared range (for example, 1,064 nm) is applied to the non-metal substrate with a converging point on the inside of its area to be divided is now undertaken. This dividing method making use of laser beam processing is to divide a non-metal substrate by applying a laser beam having an infrared range with its converging point on the inside of the non-metal substrate from one side of the non-metal substrate so as to continuously form a deteriorated layer in the inside of the non-metal substrate along dividing lines, as disclosed by JP-A 2002-192367, for example.

However, there is a case where a deteriorated layer cannot be exposed to one side that is the side to which a laser beam is applied even when the deteriorated layer is formed along the dividing lines in the inside of the non-metal substrate by applying a laser beam having an infrared range from one side of the non-metal substrate, with its converging point on the inside thereof. Further, there is a problem that after a circuit such as LSI has been formed on the front surface of the silicon wafer having, for instance, a thickness of 500 μm and the rear surface of the silicon wafer has been ground to a thickness of 100 μm, even when a laser beam is applied from the rear surface of the silicon wafer with the converging point on the vicinity of the front surface to form a deteriorated layer so as to expose it to the front surface, the deteriorated layer is not exposed to the front surface uniformly and also to the rear surface uniformly. That is, when the brittle material of the silicon wafer is ground to a thickness of about 100 μm, the unevenness of a circuit such as LSI formed on the front surface is transferred to the rear surface of the silicon wafer with the result that the rear surface has undulation of about 5 to 10 μm, whereby the converging point of the laser beam becomes nonuniform in the thickness direction and the deteriorated layer is not exposed to the front surface and also to the rear surface uniformly. Therefore, when external force is exerted on the non-metal substrate having a deteriorated layer formed therein along the dividing lines to divide it, the front surface side where the deteriorated layer is not formed cannot be divided at a right angle to the front surface, and chipping occurs with the result of a reduction in yield.

SUMMARY OF THE INVENTION

It is an object of the present invention to provide a method of dividing a non-metal substrate along dividing lines by applying a laser beam with its converging point on the inside of the non-mal substrate to form a deteriorated layer along the dividing lines in the inside thereof, whereby the non-metal substrate can be divided along the dividing lines smoothly without generating chips.

According to the present invention, the above object can be attained by a method of dividing a non-metal substrate having a first surface and a second surface formed parallel to the first surface, comprising:

a deteriorated layer forming step for forming a deteriorated layer in the inside of the non-metal substrate along dividing lines by applying a laser beam capable of passing through the non-metal substrate to the non-metal substrate from the first surface side, with its converging point on the inside thereof; and a deteriorated layer exposing step for exposing the deteriorated layer to the first surface side by grinding the first surface of the non-metal substrate having the deteriorated layer formed therein.

Preferably, the above deteriorated layer forming step is carried out by adjusting the converging point of the laser beam such that the above deteriorated layer is exposed to the second surface of the non-metal substrate. Further, the above deteriorated layer forming step is carried out a plurality of times by shifting the converging point of the laser beam stepwise in the thickness direction of the above non-metal substrate to form a plurality of deteriorated layers in the thickness direction of the non-metal substrate.

Further, the method of dividing a non-metal substrate according to the present invention comprises a dividing step for dividing the non-metal substrate along the above dividing lines by exerting external force on the above deteriorated layer after the above deteriorated layer exposing step.

Preferably, the method of dividing anon-metal substrate according to the present invention further comprises a mirror-finishing step for mirror-finishing the first surface of the non-metal substrate before the above deteriorated layer exposing step. Preferably, the mirror-finishing step is to grind the non-metal substrate so as to leave a predetermined thickness or more.

Other features of the present invention will become apparent from the following description.

DETAILED DESCRIPTION OF THE PREFERRED EMBODIMENTS

The method of dividing a non-metal substrate according to the present invention will be described in more detail hereinbelow with reference to the accompanying drawings.

Figure 1:
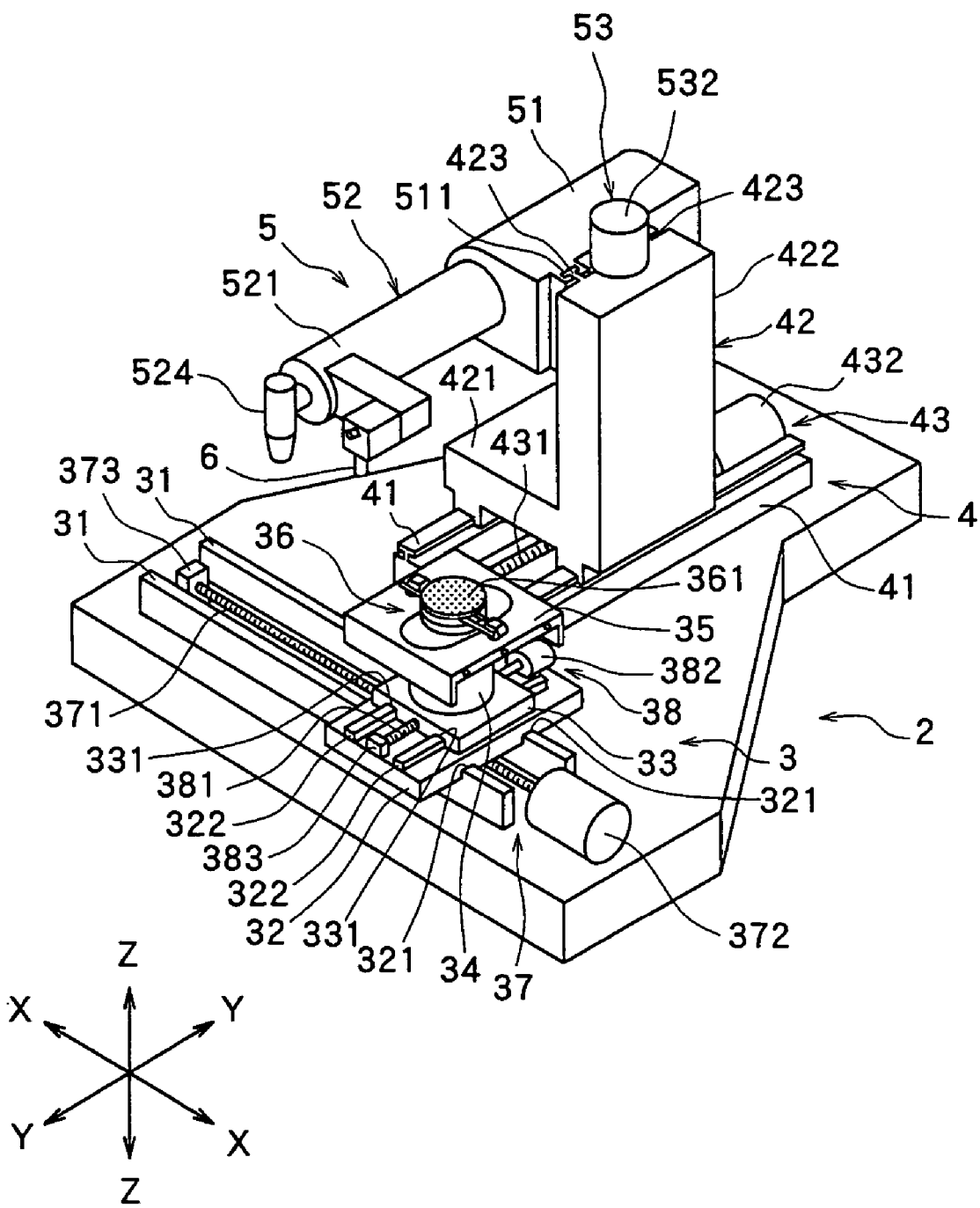
FIG. 1 is a perspective view of a laser beam machine for carrying out a method of dividing a non-metal substrate according to the present invention.

FIG. 1 is a perspective view of a laser beam machine for applying a laser beam to a non-metal substrate in the method of dividing a non-metal substrate such as a semiconductor wafer according to the present invention. The laser beam machine shown in FIG. 1 comprises a stationary base 2, a chuck table unit 3 for holding a workpiece, which is disposed on the stationary base 2 in such a manner that it can move in a direction indicated by an arrow X, a laser beam application unit support mechanism 4 disposed on the stationary base 2 in such a manner that it can move in a direction indicated by an arrow Y perpendicular to the direction indicated by the arrow X, and a laser beam application unit 5 disposed to the laser beam application unit support mechanism 4 in such a manner that it can move in a direction indicated by an arrow Z.

The above chuck table unit 3 comprises a pair of guide rails 31 and 31 that are mounted on the stationary base 2 and arranged parallel to each other in the direction indicated by the arrow X, a first sliding block 32 arranged on the guide rails 31 and 31 in such a manner that it can move in the direction indicated by the arrow X, a second sliding block 33 arranged on the first sliding block 32 in such a manner that it can move in the direction indicated by the arrow Y, a support table 35 supported on the second sliding block 33 by a cylindrical member 34, and a chuck table 36 as a workpiece holding means. This chuck table 36 comprises an adsorption chuck 361 made of a porous material so that a disk-like semiconductor wafer as a workpiece for example is held on the adsorption chuck 361 by a suction means that is not shown. The chuck table 36 is turned by a pulse motor (not shown) installed in the cylindrical member 34.

The above first sliding block 32 has, on its under surface, a pair of to-be-guided grooves 321 and 321 to be fitted onto the above pair of guide rails 31 and 31 and, on its top surface, a pair of guide rails 322 and 322 formed parallel to each other in the direction indicated by the arrow Y. The first sliding block 32 constituted as described above can move in the direction indicated by the arrow X along the pair of guide rails 31 and 31 by fitting the to-be-guided grooves 321 and 321 onto the pair of guide rails 31 and 31, respectively. The chuck table unit 3 in the illustrated embodiment comprises a moving means 37 for moving the first sliding block 32 along the pair of guide rails 31 and 31 in the direction indicated by the arrow X. The moving means 37 has a male screw rod 371 arranged between the above pair of guide rails 31 and 31 and parallel thereto, and a drive source such as a pulse motor 372 for rotary-driving the male screw rod 371. The male screw rod 371 is, at its one end, rotatably supported on a bearing block 373 fixed on the above stationary base 2 and is, at its other end, transmission-coupled to the output shaft of the above pulse motor 372 by a speed reducer that is not shown. The male screw rod 371 is screwed into a threaded through-hole formed in a female screw block (not shown) projecting from the under surface of the center portion of the first sliding block 32. Therefore, by driving the male screw rod 371 in a normal direction or a reverse direction by the pulse motor 372, the first sliding block 32 is moved along the guide rails 31 and 31 in the direction indicated by the arrow X.

The above second sliding block 33 has, on its under surface, a pair of to-be-guided grooves 331 and 331 to be fitted onto the pair of guide rails 322 and 322 installed on the top surface of the above first sliding block 32, and can move in the direction indicated by the arrow Y by fitting the to-be-guided grooves 331 and 331 onto the pair of guide rails 322 and 322, respectively. The chuck table unit 3 in the illustrated embodiment comprises a moving means 38 for moving the second sliding block 33 in the direction indicated by the arrow Y along the pair of guide rails 322 and 322 installed on the first sliding block 32. The moving means 38 comprises a male screw rod 381 that is arranged between the above pair of guide rails 322 and 322 and parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at its other end, transmission-coupled to the output shaft of the above pulse motor 382 by a speed reducer that is not shown. The male screw rod 381 is screwed into a threaded through-hole formed in a female screw block (not shown) projecting from the under surface of the center portion of the second sliding block 33. Therefore, by driving the male screw rod 381 in a normal direction or a reverse direction by the pulse motor 382, the second sliding block 33 is moved along the guide rails 322 and 322 in the direction indicated by the arrow Y.

The above laser beam application unit support mechanism 4 comprises a pair of guide rails 41 and 41 mounted on the stationary base 2 and arranged parallel to each other in the indexing direction indicated by the arrow Y and a movable support base 42 mounted on the guide rails 41 and 41 in such a manner that it can move in the direction indicated by the arrow Y. This movable support base 42 comprises a movable support portion 421 movably mounted on the guide rails 41 and 41 and amounting portion 422 mounted on the movable support portion 421. The mounting portion 422 is provided with a pair of guide rails 423 and 423 extending in the direction indicated by the arrow Z on one side surface. The laser beam application unit support mechanism 4 in the illustrated embodiment comprises a moving means 43 for moving the movable support base 42 along the pair of guide rails 41 and 41 in the indexing direction indicated by the arrow Y. This moving means 43 comprises a male screw rod 431 arranged between the above pair of guide rails 41 and 41 and parallel thereto, and a drive source such as a pulse motor 432 for rotary-driving the male screw rod 431. The male screw rod 431 is, at its one end, rotatably supported to a bearing block (not shown) fixed on the above stationary base 2 and is, at its other end, transmission-coupled to the output shaft of the above pulse motor 432 by a speed reducer that is not shown. The male screw rod 431 is screwed into a threaded through-hole formed in a female screw block (not shown) projecting from the under surface of the center portion of the movable support portion 421 constituting the movable support base 42. Therefore, by driving the male screw rod 431 in a normal direction or a reverse direction by the pulse motor 432, the movable support base 42 is moved along the guide rails 41 and 41 in the indexing direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 installed on the above mounting portion 422 and is supported in such a manner that it can move in the direction indicated by the arrow Z by fitting the to-be-guided grooves 511 and 511 onto the above guide rails 423 and 423, respectively.

Figure 2:
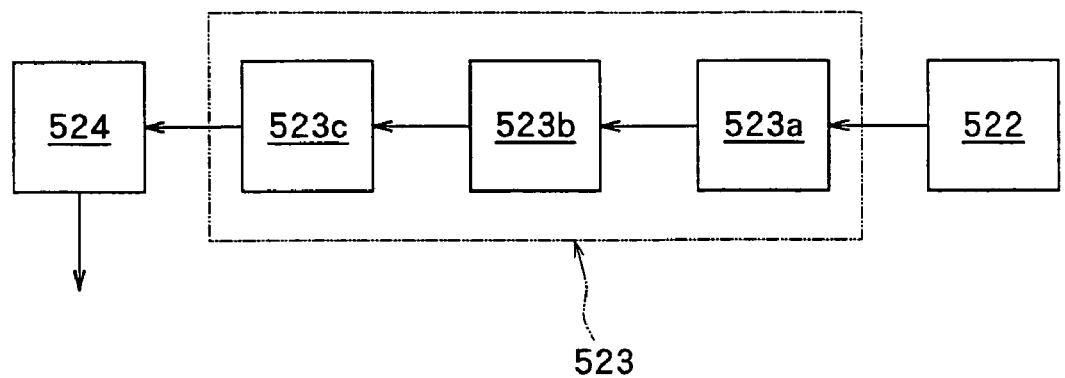
FIG. 2 is a block diagram schematically showing the constitution of a laser beam processing means equipped for the laser beam machine shown in FIG. 1.

The illustrated laser beam application means 52 comprises a cylindrical casing 521 that is secured to the above unit holder 51 and extends substantially horizontally. In the casing 521, there are installed a laser beam oscillation means 522 and a laser beam modulation means 523 as shown in FIG. 2. A YAG laser oscillator or YVO4 laser oscillator may be used as the laser beam oscillation means 522. The laser beam modulation means 523 comprises a repetition frequency setting means 523$a$, a laser beam pulse width setting means 523$b$ and a laser beam wavelength setting means 523$c$. The repetition frequency setting means 523$a$, laser beam pulse width setting means 523$b$ and laser beam wavelength setting means 523$c$, which constitute the laser beam modulation means 523, may be known devices to people of ordinary skill in the art and therefore, detailed descriptions of their structures are omitted in this text. A condenser 524 that may be a known device is attached to the end of the above casing 521.

A laser beam oscillated from the above laser beam oscillation means 522 reaches the condenser 524 via the laser beam modulation means 523. The repetition frequency setting means 523$a$ of the laser beam modulation means 523 modulates the laser beam into a pulse laser beam having a predetermined repetition frequency, the laser beam pulse width setting means 523$b$ sets the pulse width of the pulse laser beam to a predetermined width, and the laser beam wavelength setting means 523$c$ sets the wavelength of the pulse laser beam to a predetermined value.

An image pick-up means 6 is situated at a front end of the casing 521 constituting the above laser beam application means 52. This image pick-up means 6 in the illustrated embodiment comprises an ordinary image pick-up device (CCD) for picking up an image with visible radiation, and besides, an infrared illuminating means for applying infrared radiation to the workpiece, an optical system for capturing the infrared radiation applied by the infrared illuminating means, and an image pick-up device (infrared CCD) for outputting an electric signal corresponding to the infrared radiation captured by the optical system, and transmits a signal of the image picked-up to a control means that is not shown.

The laser beam application unit 5 in the illustrated embodiment comprises a moving means 53 for moving the unit holder 51 along the pair of guide rails 423 and 423 in the direction indicated by the arrow Z. Like the aforementioned moving means, the moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or a reverse direction by the pulse motor 532, the unit holder 51 and the laser beam application means 52 are moved along the guide rails 423 and 423 in the direction indicated by the arrow Z.

A description is subsequently given of the method of dividing a silicon wafer as the semiconductor wafer 10 into individual semiconductor chips.

Figure 3:
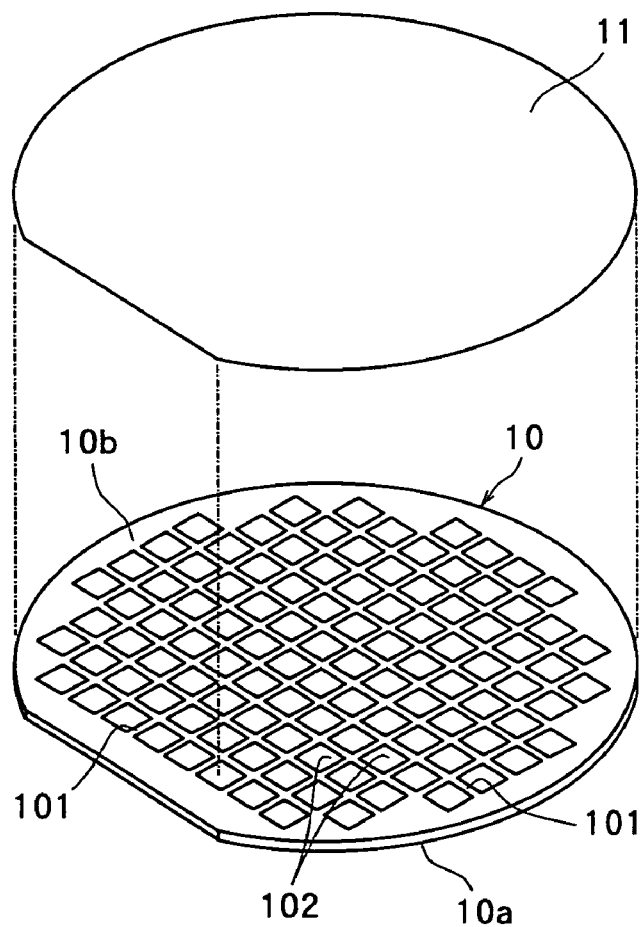
FIG. 3 is a perspective view of a semiconductor wafer as a non-metal substrate to be divided by the dividing method according to the present invention.
Figure 4:
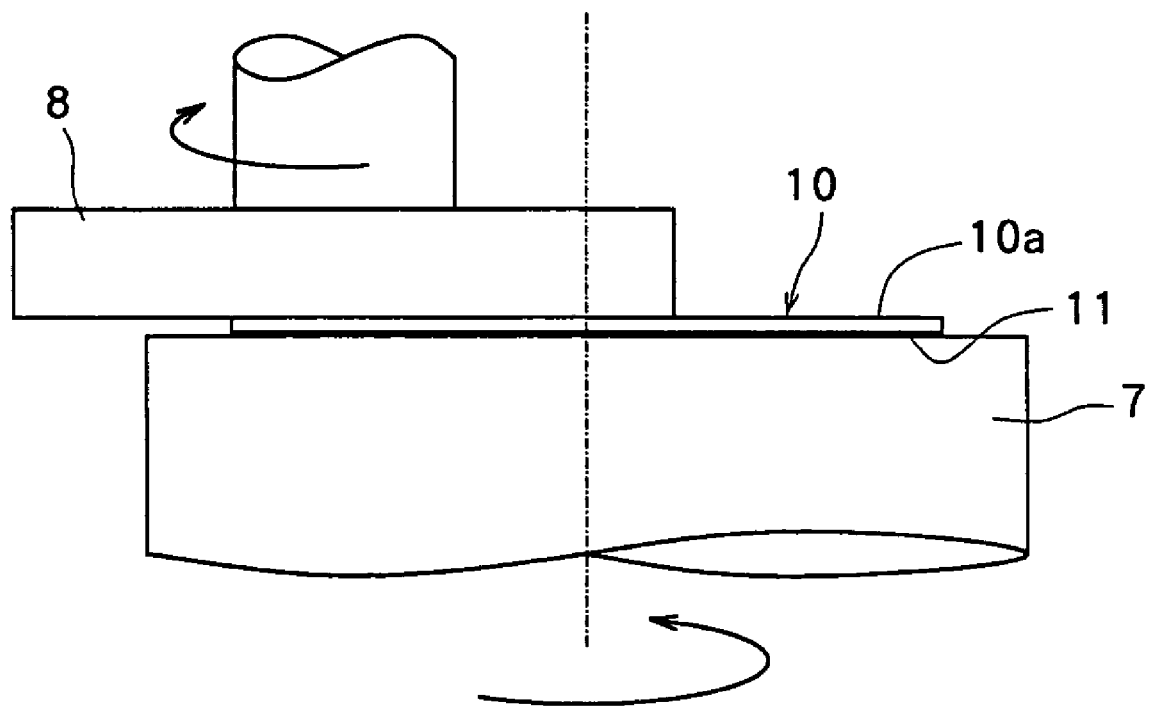
FIG. 4 is an explanatory view showing the mirror-finishing step in the dividing method according to the present invention.

As shown in FIG. 3, the semiconductor wafer 10 has a first surface 10$a$ (lower surface in the drawing) and a second surface 10$b$ (upper surface in the drawing) formed parallel to the first surface 10$a$, and has a thickness of 625 μm, for example. A plurality of areas are sectioned by a plurality of streets (dividing lines) 101 arranged in a lattice form on the second surface 10$b$ of the semiconductor wafer 10, and a circuit 102 such as IC or LSI is formed in each of the sectioned areas. A protective tape 11 is affixed to the second surface 10$b$ of the semiconductor wafer 10 thus constituted. Then, as shown in FIG. 4, the semiconductor wafer 10 is placed on the chuck table 7 of a grinding device in such a manner that the protective tape 11 side comes into contact with the surface of the chuck table 7 (therefore, the first surface 10$a$ of the semiconductor wafer 10 faces up) and is suction-held on the chuck table 7 by a suction means that is not shown. Then, the grinding stone 8 (e.g., #2000 resin grinding stone) is rotated at 6,000 rpm in the direction indicated by the arrow in the drawing while the chuck table 7 is rotated at 300 rpm in the direction indicated by the arrow in the drawing to mirror-finish the first surface 10$a$ of the semiconductor wafer 10 (mirror finishing step). In this mirror finishing step, the first surface 10$a$ of the semiconductor wafer 10 is mirror-finished to a surface roughness (Ra) specified by JIS B0601 of 0.05 μm or less (Ra$\leq$0.05 μm), preferably 0.02 μm or less (Ra$\leq$0.02 μm) and a thickness of more than 300 μm. That is, when the silicon wafer has at least predetermined thickness, for example, more than 300 μm, the rear surface can be ground flat without transferring the unevenness of the circuit 102 such as IC or LSI formed on the front surface to the rear surface by grinding.

After the first surface 10$a$ of the semiconductor wafer 10 is mirror-finished as described above, the semiconductor wafer 10 is carried onto the adsorption chuck 361 of the chuck table 36 constituting the chuck table unit 3 of the laser beam machine shown in FIG. 1 in such a manner that the first surface 10a faces up, and suction-held on the adsorption chuck 361. The chuck table 36 suction-holding the semiconductor wafer 10 is moved along the guide rails 31 and 31 by the operation of the moving means 37 to be positioned right below the image pick-up means 6 attached to the laser beam application unit 5.

After the chuck table 36 is positioned right below the image pick-up means 6, image processing such as pattern matching is carried out to align a street 101 formed on the semiconductor wafer 10 in a first direction with the condenser 524 of the laser beam application unit 5 for applying a laser beam along the street 101 by the image pick-up means 6 and a control means that is not shown, thereby performing the alignment of a laser beam application position. Similarly, the alignment of the laser beam application position is also carried out for streets 101 that is formed on the semiconductor wafer 10 and extends in a second direction. On this occasion, although the second surface 10b having the street 101 formed thereon of the semiconductor wafer 10 faces down, an image of the street 101 can be picked up through the rear surface as the image pick-up means 6 is constituted by an infrared illuminating means, an optical system for capturing infrared radiation and an image pick-up device (infrared CCD) for outputting an electric signal corresponding to the infrared radiation as described above.

Figure 5:
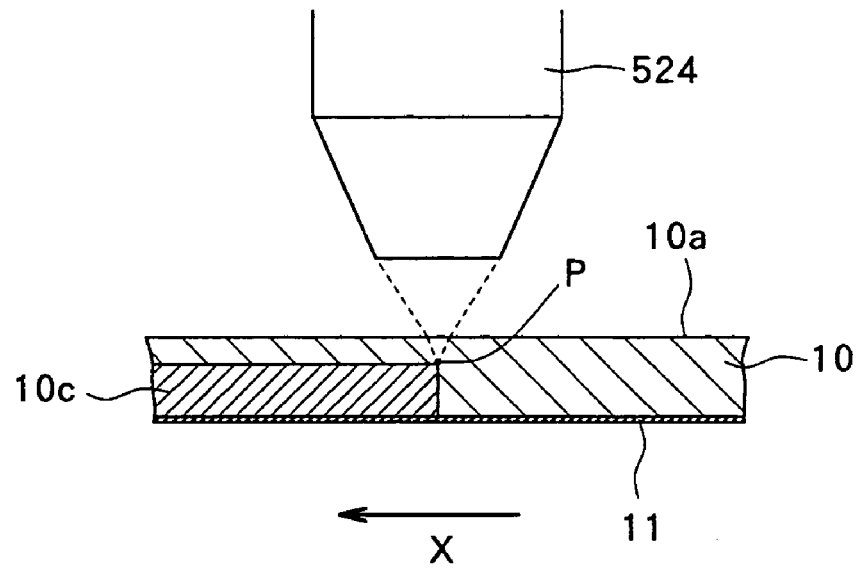
FIG. 5 is an explanatory view showing an example of the deteriorated layer forming step in the dividing method according to the present invention.

After the street 101 formed on the semiconductor wafer 10 held on the chuck table 36 is detected and the alignment of the laser beam application position is carried out, the chuck table 36 is moved to a laser beam application range where the condenser 524 of the laser beam application unit 5 for applying a laser beam is located, and a laser beam is applied from the condenser 524 of the laser beam application unit 5 along the street 101 of the semiconductor wafer 10. At this point, a laser beam is focused on the inside of the semiconductor wafer 10 through the mirror-finished first surface 10a of the semiconductor wafer 10, that is, in the vicinity of the second surface 10b as shown in FIG. 5 so as to form a deteriorated layer along the street 101 in the inside of the semiconductor wafer 10 (deteriorated layer forming step).

The deteriorated layer forming step will be described hereinbelow.

In the deteriorated layer forming step, the chuck table 36, in other words, the semiconductor wafer 10 held on the chuck table 36 is moved in the direction indicated by the arrow X at a predetermined feed rate (for example, 100 mm/sec) while a pulse laser beam is applied to a predetermined street 101 on the semiconductor wafer 10 from the condenser 524 of the laser beam application unit 5 for applying a laser beam. In the deteriorated layer forming step, the following laser beam is applied as the laser beam.

Figure 6:
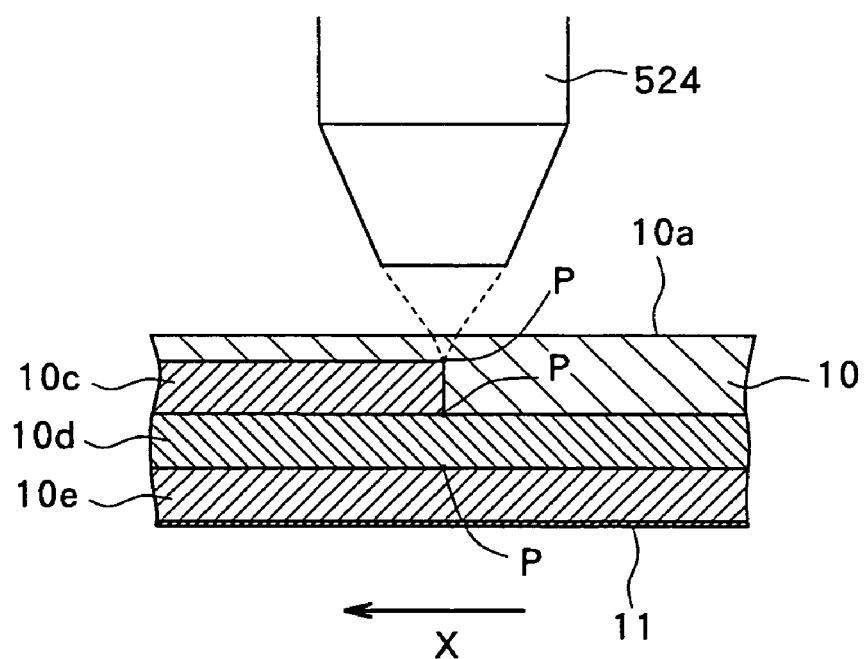
FIG. 6 is an explanatory view showing another example of the deteriorated layer forming step in the dividing method according to the present invention.

Light source: YVO4 laser
Wavelength: 1,064 nm (infrared laser beam)
Output of one pulse: 10 μJ
Repetition frequency: 100 kHz
Pulse width: 40 ns
Focusing spot diameter: 1 μm An infrared laser beam having a long wavelength is used as the laser beam applied in the above deteriorated layer forming step, and focused on the inside through the first surface 10a of the semiconductor wafer 10 as shown in FIG. 5. For example, a deteriorated layer 10c having a depth of about 30 to 50 μm is continuously formed along the street in the inside of the semiconductor wafer 10 by moving the semiconductor wafer 10 in the direction indicated by the arrow X while a laser beam is applied with its converging point P adjusted on the inside at a position 5 to 10 μm away from the second surface 10b of the semiconductor wafer 10. On this occasion, it is desired that the converging point P of the laser beam should be adjusted to ensure that the under surface in the drawing of the deteriorated layer 10c is exposed to the second surface 10b of the semiconductor wafer 10. To apply an infrared laser beam with its converging point P on the inside of the semiconductor wafer 10, the first surface 10a of the semiconductor wafer 10 is desirably mirror-finished. If the first surface 10a of the semiconductor wafer 10 is not mirror-finished, that is, the surface to which the infrared laser beam is applied is rough, the diffused reflection of the infrared laser beam will occur on the surface, and the laser beam will not reach the predetermined converging point, thereby making it impossible to form the predetermined deteriorated layer in the inside. According to experiments conducted by the inventor of the present invention, when the surface roughness (Ra) of the first surface 10a of the semiconductor wafer 10 was 0.1 μm, a deteriorated layer having a predetermined depth could not be formed in the inside of the semiconductor wafer 10. On the other hand, when the first surface 10a of the semiconductor wafer 10 was mirror-finished to a surface roughness (Ra) of 0.05 μm, a deteriorated layer having a substantially predetermined depth could be formed in the predetermined inside. Particularly when the first surface 10a of the semiconductor wafer 10 was mirror-finished to a surface roughness (Ra) of 0.02 μm or less, a deteriorated layer having a depth of 50 μm was formed in the inside. When the final thickness of the semiconductor wafer 10 is 100 μm or more in the above deteriorated layer forming step, a plurality of deteriorated layers 10c, 10d and 10e (three layers in FIG. 6) are desirably formed by applying an infrared laser beam a plurality of times by shifting its converging point P stepwise as shown in FIG. 6. The formation of these deteriorated layers 10c, 10d and 10e is preferably carried out by changing the converging point of the laser beam stepwise in the order of 10e, 10d and 10c. That is, when the deteriorated layer 10c is first formed, the deteriorated layer 10c hinders the formation of the deteriorated layers 10d and 10e. The reason why the infrared laser beam is used in the deteriorated layer forming step is that an ultraviolet laser beam having a short wavelength reflects on the surface and does not reach the inside of a silicon wafer. Therefore, it is important to select a laser beam having a wavelength that can pass through a non-metal substrate.

Figure 7:
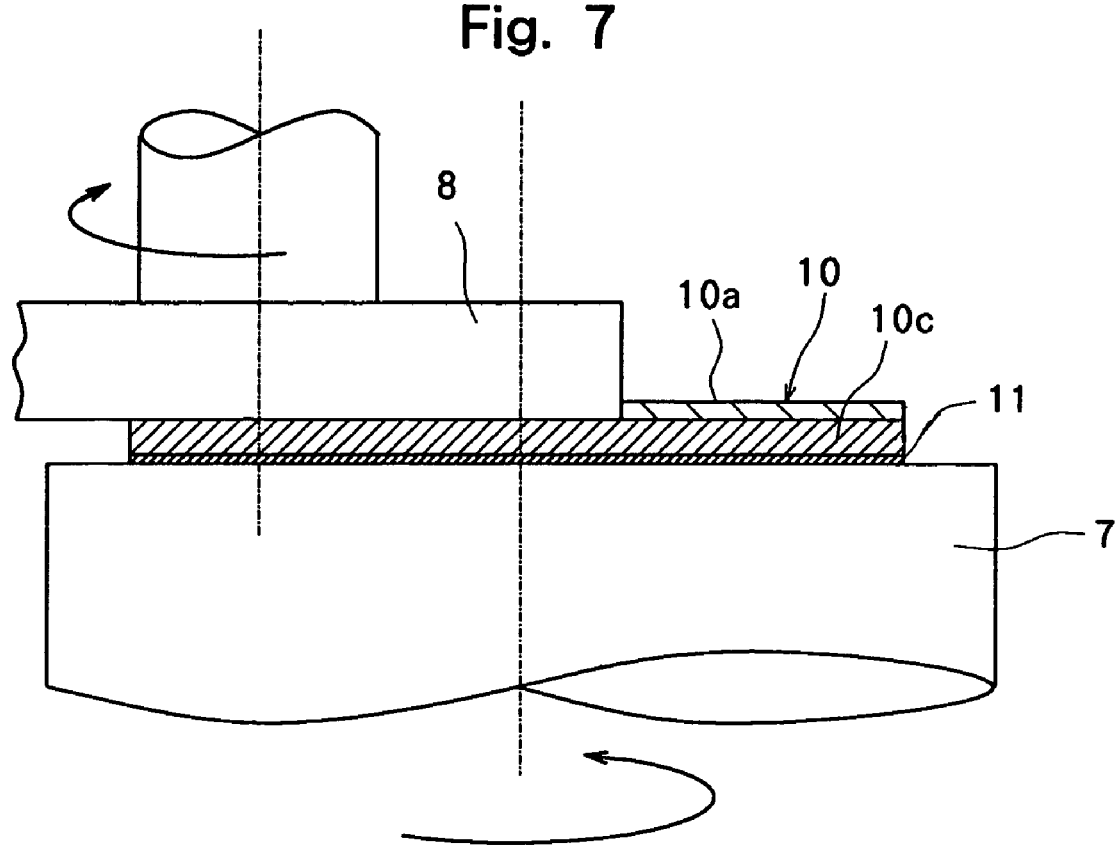
FIG. 7 is an explanatory view showing the deteriorated layer exposing step in the dividing method according to the present invention.
Figure 8:
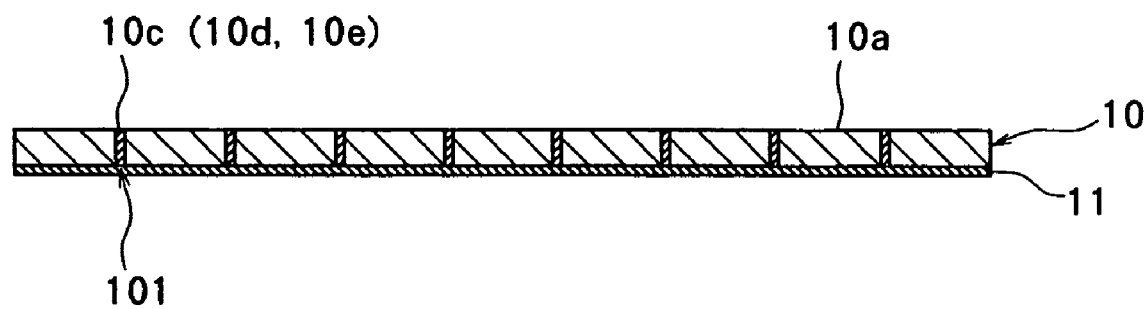
FIG. 8 is a sectional view of a semiconductor wafer as the non-metal substrate having a deteriorated layer exposed by the deteriorated layer exposing step.

After the above deteriorated layer forming step, the deteriorated layer exposing step for exposing the deteriorated layer 10c (10d, 10e) formed in the inside of the semiconductor wafer 10 to the first surface 10a is carried out. That is, as shown in FIG. 7, the semiconductor wafer 10 is placed on the chuck table 7 of the grinding device in such a manner that the protective tape 11 side comes into contact with the chuck table 7 (that is, the first surface 10a of the semiconductor wafer 10 faces up), and suction-held on the chuck table 7 by a suction means that is not shown. The first surface 10a of the semiconductor wafer 10 is ground about 150 to 250 μm by rotating the grinding stone 8 (e.g., #2000 resin grinding stone) at 6,000 rpm while the chuck table 7 is rotated at 300 rpm in the direction indicated by the arrow in the drawing. As a result, as shown in FIG. 8, the deteriorated layer 10c (10d, 10e) is exposed to the first surface 10a of the semiconductor wafer 10 along the streets 101, and further, the first surface 10a is finally ground to a thickness of 50 to 150 μm.

Figure 9:
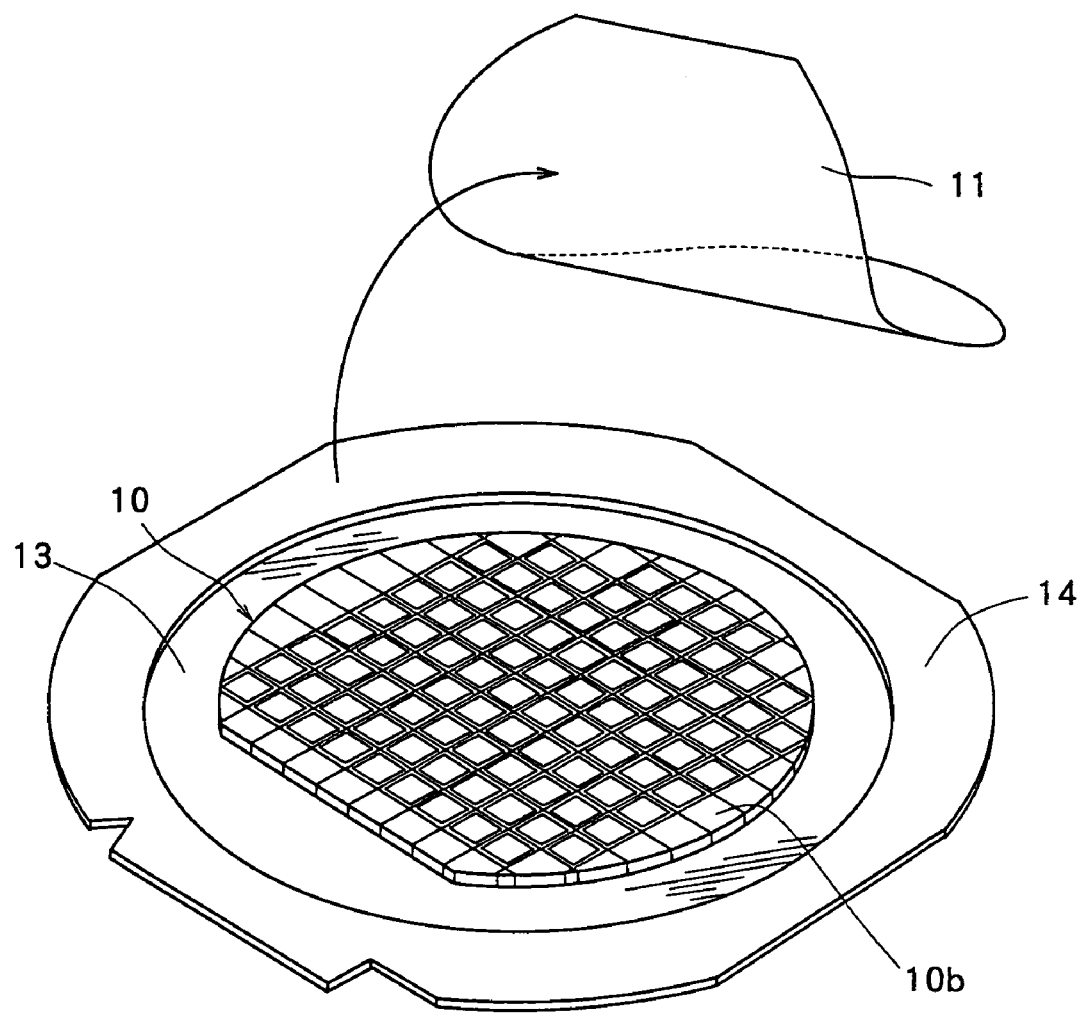
FIG. 9 is a perspective view showing a state of a semiconductor wafer as the non-metal substrate having a deteriorated layer exposed by the deteriorated layer exposing step being put on a protective adhesive tape.

After the deteriorated layer 10c (10d, 10e) is exposed to the first surface 10a of the semiconductor wafer 10 in the above deteriorated layer exposing step, the first surface 10a of the semiconductor wafer 10 is put on a protective adhesive tape 13 as shown in FIG. 9, and the protective tape 11 affixed to the second surface 10b of the semiconductor wafer 10 is removed at the same time. The protective adhesive tape 13 is an elastic synthetic resin tape such as a vinyl chloride tape, which is generally used as a dicing tape and mounted so as to cover the inner opening portion of an annular support frame 14. The first surface 10a of the semiconductor wafer 10 is put on the top of this protective adhesive tape 13. Then, the protective tape 11 affixed to the second surface 10b of the semiconductor wafer 10 is removed. An UV tape whose adhesive strength is reduced by an external stimulus such as ultraviolet radiation is used as the protective adhesive tape 13.

After the protective adhesive tape 13 is thus affixed to the first surface 10a of the semiconductor wafer 10 as described above, external force is exerted on the deteriorated layer 10c (10d, 10e) formed along the streets 101 of the semiconductor 10 to carry out the dividing step for dividing the semiconductor wafer 10 along the streets 101. This dividing step is carried out by an external force application device 9 shown in FIG. 10 and FIGS. 11(a) and 11(b). Here, the external force application device 9 will be described hereinbelow. The illustrated external force application device 9 comprises a cylindrical base 91 having a mounting surface 911 for mounting the above support frame 14 and a pressing member 92 installed in the base 91 concentrically. This pressing member 92 has a pressing surface 921 formed in a spherical shape at an upper end and can be moved in a vertical direction (i.e., axial direction of the cylindrical base 91) by a lifting means that is not shown.

The dividing step for dividing the semiconductor wafer 10 along the streets 101 using the above external force application device 9 will be described with reference to FIG. 10 and FIGS. 11(a) and 11(b).

Figure 10:
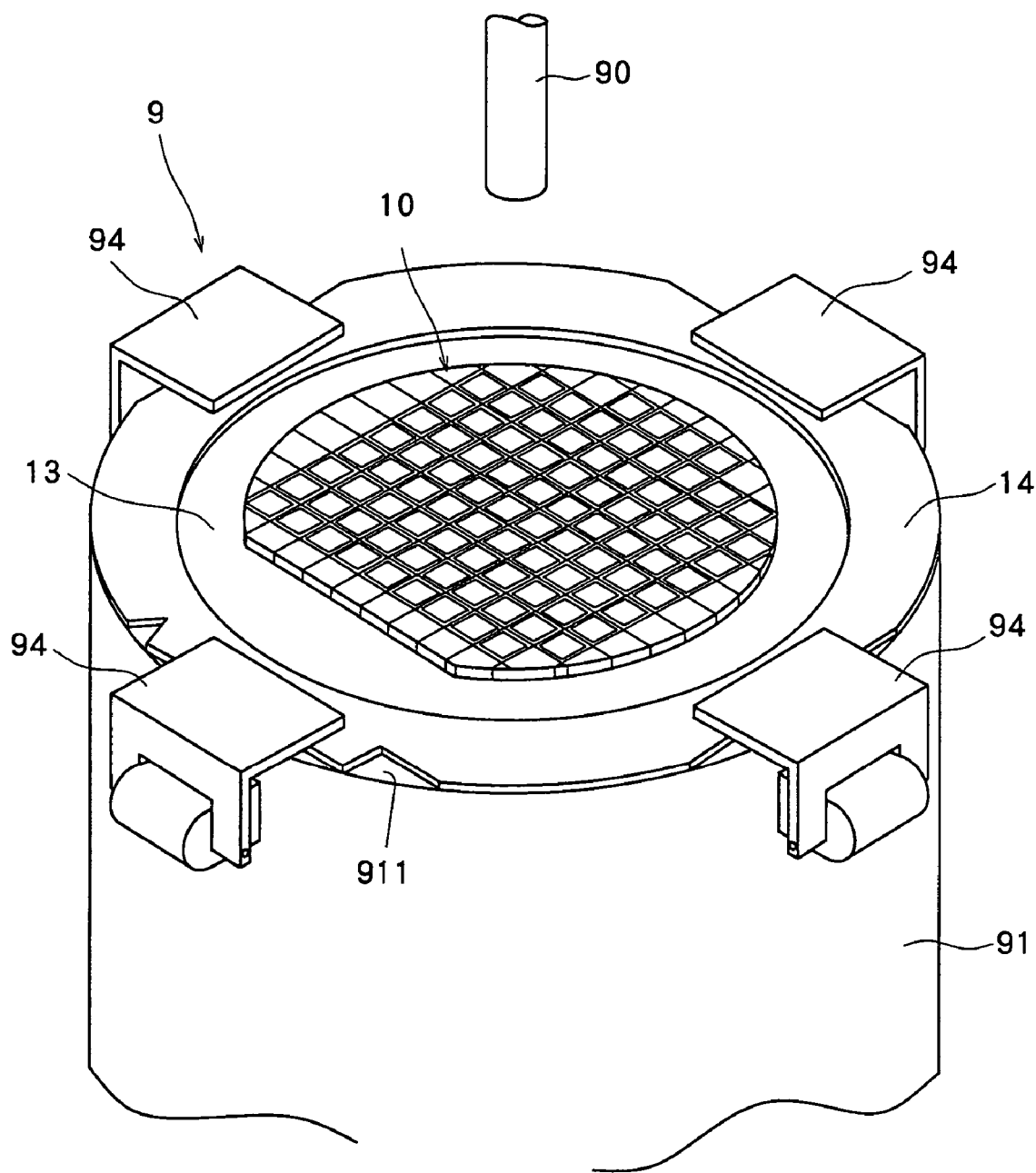
FIG. 10 is a perspective view of an external force application device for carrying out the dividing step in the dividing method according to the present invention.
Figure 11:
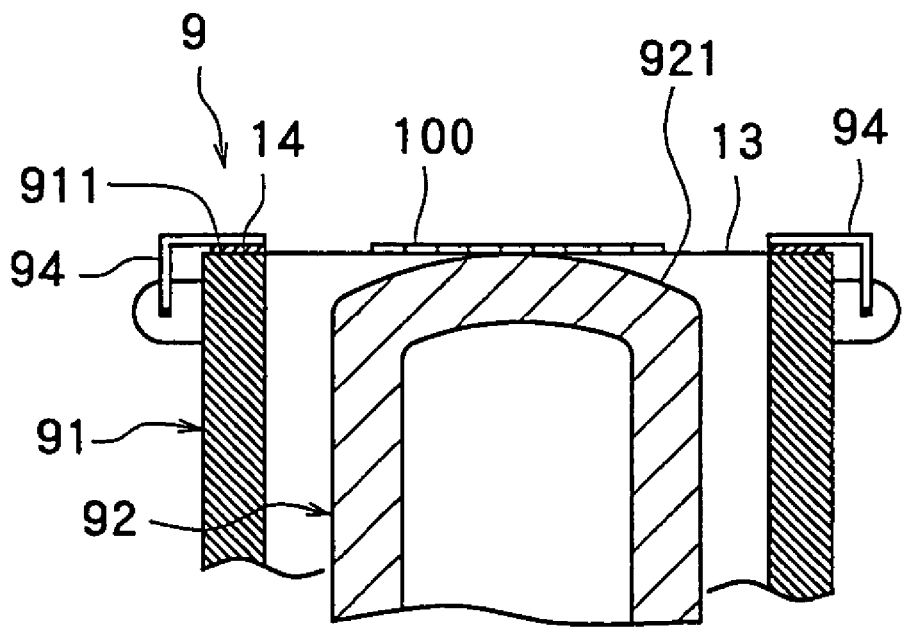
FIGS. 11(a) and 11(b) are explanatory views for illustrating the dividing step in the dividing method according to the present invention.
Figure 11:
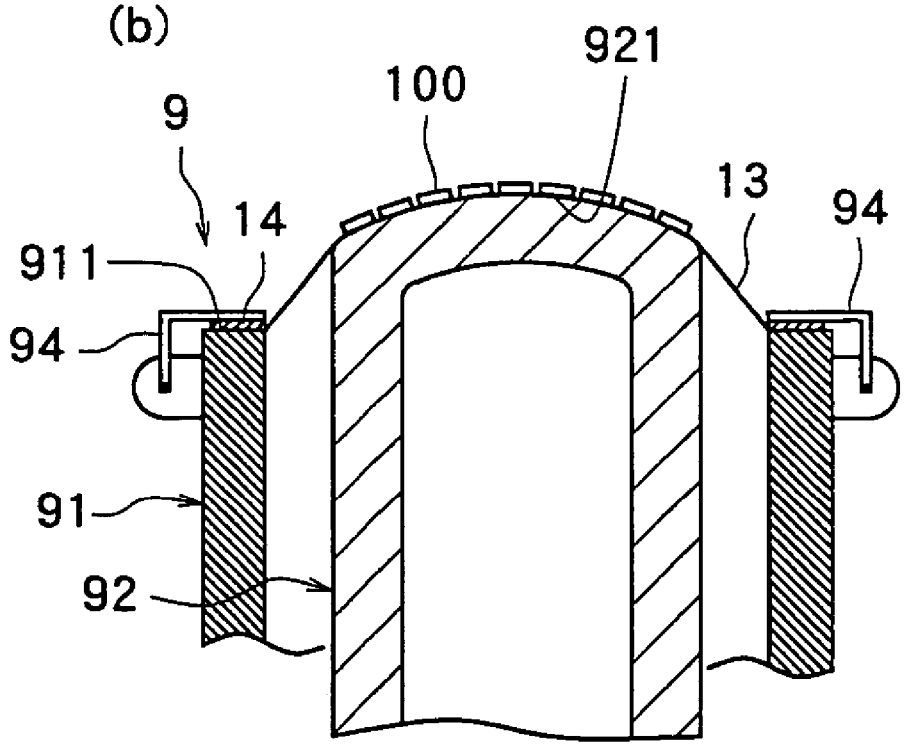

As described above, the support frame 14 for the semiconductor wafer 10 supported on the top of the elastic protective adhesive tape 13 affixed to the support frame 14 is placed on the mounting surface 911 of the cylindrical base 91 as shown in FIG. 10 and FIG. 11(a) and is secured to the base 91 by clamps 94. As shown in FIG. 11(b), the pressing member 92 is moved up to the working position by a lifting means (not shown) so that the semiconductor wafer 10 supported on the top of the protective adhesive tape 13 is pressed by the spherical pressing surface 921 of the pressing member 92. As a result, a bending load is worked to the deteriorated layer 10c (10d, 10e) formed along the streets 101 of the semiconductor wafer 10, whereby the semiconductor wafer 10 is divided into individual semiconductor chips 100 along the deteriorated layer 10c (10d, 10e), that is, the streets 101.

After the dividing step is carried out as described above, the pressing member 92 is lowered to the position shown in FIG. 11(a) by the lifting means that is not shown. Then, as shown in FIG. 10, a chip pick-up collet 90 positioned above the external force application device 9 is activated to disengage each semiconductor chip 20 from the top of the protective adhesive tape 13 and carry it to a tray that is not shown. On this occasion, ultraviolet radiation is applied to the protective adhesive tape 13 to reduce its adhesive strength, thereby making it easy to disengage the semiconductor chips 20.

In the illustrated embodiment, the above dividing step is carried out after the semiconductor wafer 10 having the deteriorated layer 10c (10d, 10e) exposed to the first surface 10a in the deteriorated layer exposing step is put on the protective adhesive tape 13. However, external force may be exerted on the deteriorated layer 10c (10d, 10e) right after the deteriorated layer exposing step in order to divide the semiconductor wafer 10 into individual semiconductor chips 100 along the deteriorated layer 10c (10d, 10e), that is, the streets 110. Thereafter, the semiconductor wafer 10 which has been divided into individual semiconductor chips 100 may be put on the protective adhesive tape 13 affixed to the support frame 14 to proceed to the pick-up step.

As described above, in the method of dividing a semiconductor wafer according to the present invention, after a laser beam is applied to dividing lines with its converging point on the inside from the first surface side of the non-metal substrate to form a deteriorated layer along the dividing lines in the inside of the non-metal substrate, the first surface of the non-metal substrate is ground to expose the deteriorated layer. Therefore, the non-metal substrate can be divided along the dividing lines smoothly.

Further, since the first surface is so ground as to leave a predetermined thickness or more when it is mirror-finished, the unevenness of a circuit such as LSI formed on the second surface is not transferred to the first surface of the non-metal substrate and hence, the first surface is not undulated. Therefore, the converging point of the laser beam can be uniformly adjusted to a desired position in the inside from the first surface side and a deteriorated layer can be formed uniformly in the second surface. Consequently, when the first surface is ground to make the thickness of the non-metal substrate to a final thickness, the deteriorated layer is exposed to the first surface uniformly.

What is claimed is:

1. A method of dividing a non-metal substrate having a first surface side and a second surface side formed parallel to the first surface, comprising:

a deteriorated layer forming step for forming a deteriorated layer in the inside of the non-metal substrate along dividing lines by applying a laser beam, capable of passing through the non-metal substrate, to the non-metal substrate from the first surface side with its converging point on the inside thereof;

a mirror-finishing step for mirror-finishing the first surface of the non-metal substrate; and after the mirror-finishing step, a deteriorated layer exposing step for exposing the deteriorated layer to the first surface side by grinding the first surface of the non-metal substrate having the deteriorated layer formed therein.

2. The method of dividing a non-metal substrate according to claim 1, wherein the deteriorated layer forming step is carried out by adjusting the converging point of the laser beam such that the deteriorated layer is exposed to the second surface of the non-metal substrate.

3. The method of dividing a non-metal substrate according to claim 1, wherein the deteriorated layer forming step is carried out a plurality of times by shifting the converging point of the laser beam stepwise in the thickness direction of the non-metal substrate to form a plurality of deteriorated layers in the thickness direction of the non-metal substrate.

4. The method of dividing a non-metal substrate according to claim 1, which comprises a dividing step for dividing the non-metal substrate along the dividing lines by exerting external force on the deteriorated layer after the deteriorated layer exposing step.

5. The method of dividing a non-metal substrate according to claim 1, wherein the mirror-finishing step is to grind the non-metal substrate so as to leave a predetermined thickness or more.

6. The method of dividing a non-metal substrate according to claim 1, wherein the non-metal substrate is a semiconductor wafer, a plurality of dividing lines are formed in a lattice form on the second surface, and a circuit is formed in each of a plurality of areas sectioned by the plurality of streets.

7. The method of dividing a non-metal substrate according to claim 1, wherein the laser beam applied in the deteriorated layer forming step is a pulse infrared laser beam.

8. The method of dividing a non-metal substrate according to claim 7, wherein the pulse infrared laser beam has a wavelength of 1064 nm.

9. The method of dividing a non-metal substrate according to claim 1, wherein the substrate has a thickness of more than 300 μm.

10. The method of dividing a non-metal substrate according to claim 9, wherein the substrate has a thickness of 625 μm.

* * * * *